United States Patent
Chen et al.

(10) Patent No.: US 6,740,570 B2
(45) Date of Patent: May 25, 2004

(54) METHOD FOR FORMING A SELF-ALIGNED SILICIDE OF A METAL OXIDE SEMICONDUCTOR

(75) Inventors: Wei-Fan Chen, Taichung (TW); Wen-Shiang Liao, Miao-Li Hsien (TW); Ming-Lun Chang, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/188,526

(22) Filed: Jul. 3, 2002

(65) Prior Publication Data

US 2003/0068866 A1 Apr. 10, 2003

(30) Foreign Application Priority Data

Oct. 9, 2001 (TW) .......................... 90124970 A

(51) Int. Cl.⁷ ............................................ H01L 21/425
(52) U.S. Cl. .................... 438/528; 438/530; 438/592; 438/664
(58) Field of Search .................... 438/407, 528, 438/530, 532, 533, 592, 659, 664, 683

(56) References Cited

U.S. PATENT DOCUMENTS

| | | | |
|---|---|---|---|
| 4,923,822 A | 5/1990 | Wang et al. | 437/41 |
| 5,047,367 A | 9/1991 | Wei et al. | 437/200 |
| 5,736,461 A | 4/1998 | Berti et al. | 438/651 |
| 5,911,114 A | 6/1999 | Naem | 438/684 |
| 6,159,856 A * | 12/2000 | Nagano | 438/683 |
| 6,232,220 B1 * | 5/2001 | Penka et al. | 438/618 |
| 6,436,783 B1 * | 8/2002 | Ono et al. | 438/232 |
| 2001/0045605 A1 * | 11/2001 | Miyashita et al. | 438/585 |

* cited by examiner

*Primary Examiner*—Chandra Chaudhari
(74) *Attorney, Agent, or Firm*—Ladas & Parry

(57) ABSTRACT

The present invention discloses a method for forming a self-aligned silicidation of a metal oxide semiconductor. The feature of the present invention is to perform an ionic implanting step before carrying on the self-aligned silicidation. The implanted ion of the present invention, such as fluorine, chlorine, bromine, iodine, boron and trifluroborane, will react with the silicon on the surface of the gate structure and the silicon substrate and a barrier effect will be formed during silicidation. Therefore, a spike phenomenon because of the penetration of cobalt or the cobalt silicide into the gate structure or the source/drain regions is prevented. The junction leakage current and the breakdown voltage of the metal oxide semiconductor are avoided.

10 Claims, 7 Drawing Sheets

METHOD FOR FORMING A SELF-ALIGNED SILICIDE OF A METAL OXIDE SEMICONDUCTOR

BACKGROUND OF THE INVENTION

1. Field of the Invention

The present invention relates to a method for forming a self-aligned silicide of a metal oxide semiconductor, and more particularly, to a method for forming a cobalt silicide ($CoSi_2$) without increasing leakage current and decreasing breakdown voltage.

2. Description of the Prior Art

Due to increasing integrity of a semiconductor, self-aligned silicidation (also called salicidation) is introduced into a semiconductor process for avoiding the leaky junction between gate and source/drain regions. The self-aligned silicidation is used to form a silicide layer on the surfaces of the gate and the source/drain region for avoiding the leakage current.

A conventional material for the silicide layer is titanium; and a process for manufacturing the silicide layer is shown in FIG. 1(a) to FIG. 1(d). First, a silicon substrate 101 having a metal oxide transistor is provided, shown in FIG. 1(a). The transistor comprises a gate structure 103, a spacer 104 disposed on the sidewalls of the gate structure 103, a source/drain region 105 disposed in at two sides of the gate structure 103 and field oxides 102. Next, a titanium metal layer 106 is deposited on the surface of the gate structure 103, the spacer 104, the source/drain 105 and field oxides 102, shown in FIG. 1(b). Then, a first thermal annealing process is performed, thus the titanium metal will react with the polysilicon of the gate structure 103 and the silicon of the source/drain region 105 to form a titanium silicide layer ($TiSi_2$) 108. However, the titanium metal on the surface of the spacer 104 and field oxides 102 will not undergo the silicidation reaction, shown in FIG. 1(c). Afterward, the unreacted titanium metal on the surface of the spacer 104 and field oxides 102 are removed by wet or dry etching, shown in FIG. 1(d). The titanium silicide layer 108 formed by the titanium metal layer 106 reacting with the polysilicon of the gate structure 103 and the silicon of the source/drain region 105 is in C49 phase which has a high sheet resistance. Therefore, the salicidation further comprises a second thermal annealing process to transfer the titanium silicide 108 from C49 phase to C54 phase which has a lower sheet resistance.

Since the line width of a semiconductor device is becoming smaller and smaller, the sheet resistance and the junction current leakage, caused by the titanium silicide, are becoming higher and higher. Since the cobalt silicide ($CoSi_2$) has a lower sheet resistance, thus the cobalt metal are widely used as a material for the silicide layer in the semiconductor process, especially below 0.25 um.

Generally, the formation of the cobalt silicide is similar to the titanium silicide. However, the nature of the cobalt silicide causes the disadvantages mentioned thereinafter. First, the cobalt metal is easy to react with oxygen, and thus the resistance will be increased. Second, the native oxide on the surface of the silicon substrate has to be removed before depositing the cobalt metal. Third, the cobalt-silicon phase is nearer the mid-bandgap level than the titanium-silicon phase. That will makes the cobalt metal or the cobalt silicide penetrate the silicon substrate and cause the spike phenomenon. Moreover, in shallow junction structure, the junction current leakage and the decreasing of the breakdown voltage are easy to be caused. Therefore, the method for forming cobalt silicide is more complex than the method for forming titanium silicide.

U.S. Pat. No. 5,047,367 discloses a method for forming a metal silicide layer by using a bilayer method. That is, a titanium layer is deposited on the surface of a silicon substrate. A cobalt layer is deposited on the surface of the titanium layer and then a thermal annealing step is performed under nitrogen gas. During the thermal annealing step, the cobalt metal will transfer to the surface of the silicon substrate to form a cobalt silicide layer. The titanium metal will transfer to the surface of the silicon substrate to react and remove native oxide ($SiO_2$) and to form titanium silicide ($TiSi_2$). Although the step of removing the native oxide is omitted in this method of forming the silicon nitride layer, the cobalt titanium ($CoTi_2$) will be formed at the interface of the cobalt and titanium. Thus the formation of the cobalt silicide is inhibited and the junction current leakage is caused. In addition, because the cobalt is ferromagnetic, it will cause the problem of uniformity and poor reproducibility during sputtering.

U.S. Pat. Nos. 4,923,822 and 5,911,114 disclose a method for forming a cobalt silicide layer, wherein a titanium nitride (TiN) is deposited on a surface of a deposited cobalt layer as a capping layer. Therefore, the cobalt titanium, formed by the cobalt metal during silicidation and inhibits the formation of the cobalt silicide, is avoided. However, the cobalt silicide formed in the above patents still cannot solve the problems of spike phenomenon and junction current leakage. In addition, U.S. Pat. No. 5,736,461 discloses a method for forming a cobalt silicide by using titanium as a capping layer. Since titanium has a character of gettering the native oxide of the surface of the silicon substrate, it is not necessary to carry on a clean step for removing the native oxide on the surface of the silicon substrate before depositing the cobalt metal. However, the formation of the cobalt titanium and spike phenomenon also cannot be solved in this method.

SUMMARY OF THE INVENTION

An objective of the present invention is to provide a method for forming a cobalt silicide layer, wherein the cobalt metal cannot penetrate into the silicon layer because of a barrier effect, which is achieved by ionic implantation. Therefore, the cobalt silicide of the present invention can grow rapidly without increasing leakage current and decreasing breakdown voltage.

Another objective of the present invention is to provide a method for forming a cobalt silicide without a capping layer, and thus the cobalt metal reacts with the capping layer to facilitate formation of the cobalt silicide.

In order to achieve the above objects and to avoid the disadvantages of the prior art, the present invention discloses a method for forming a cobalt silicide on a metal oxide semiconductor. The method comprise the steps of:

providing a silicon substrate, comprising a gate structure, lightly doped regions disposed at two sides of the gate structure, spacer disposed on the sidewall of the gate structure and field oxides;

proceeding with a heavily doping step to form source/drain regions;

depositing a cobalt layer on the surface of field oxides, source/drain regions, spacer and the gate structure;

proceeding with an ionic implanting step; and proceeding with a thermal annealing step to make the cobalt metal on the surface of the source/drain regions and the gate structure become the cobalt silicide and then removing unreacted cobalt on the surface of the spacer and field oxides.

A feature of the present invention is to perform an ionic implanting step before carrying on the self-aligned silicidation. The implanted ion of the present invention, such as fluorine, chlorine, bromine, iodine, boron and trifluroborane, will react with the silicon on the surface of the gate structure and the silicon substrate, and a barrier effect will be formed during the silicidation. Therefore, the spike phenomenon because of the cobalt or the cobalt silicide penetrating into the gate structure or the source/drain regions is prevented. Thus, the junction leakage current is avoided and the breakdown voltage of the metal oxide semiconductor will not be lowered.

The foregoing and other objects and advantages of the invention and the manner in which the same are accomplished will become clearer based on the following detailed description taken in conjunction with the accompanying drawings.

DETAILED DESCRIPTION OF THE INVENTION

Figure 1A:
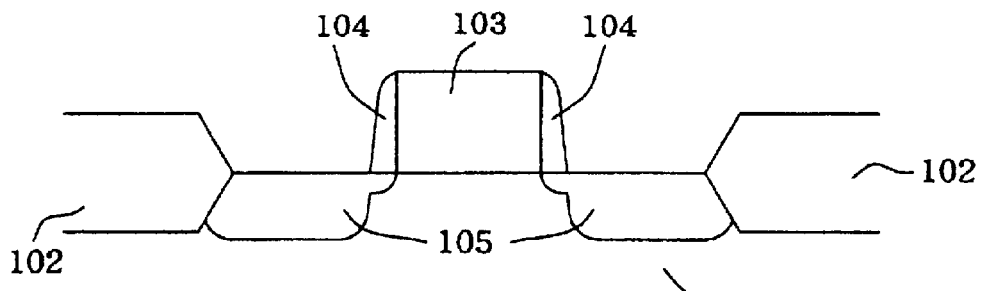
FIGS. 1(a) to 1(d) depict structures achieved in steps of a conventional method of a self-aligned silicidation.
Figure 1B:
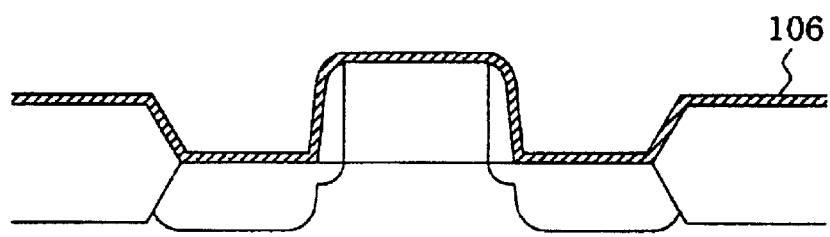
Figure 1C:
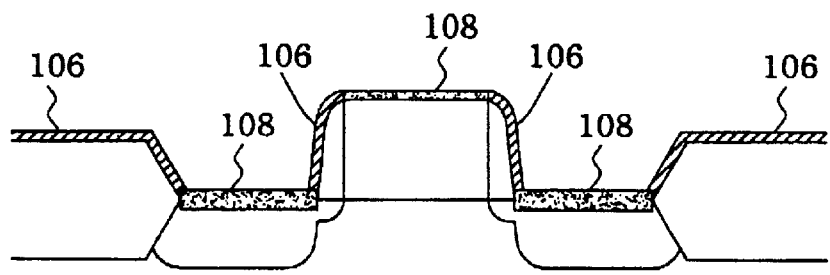
Figure 1D:
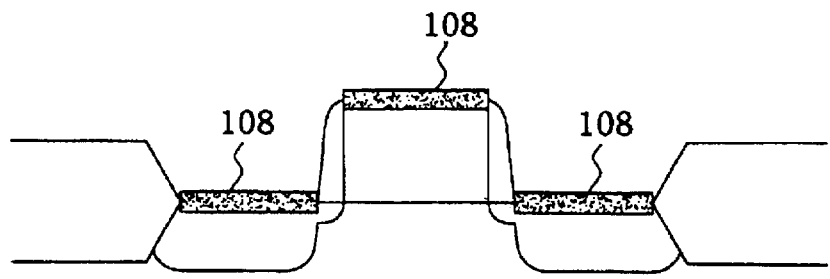
Figure 2A:
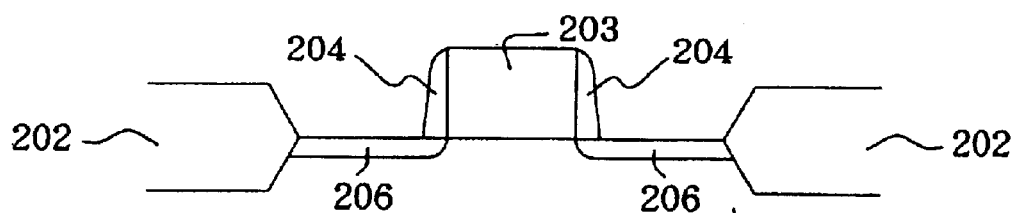
FIGS. 2(a) to 2(e) depict structures achieved in steps of a method for forming the self-aligned silicide according to a first embodiment of the present invention.
Figure 2B:
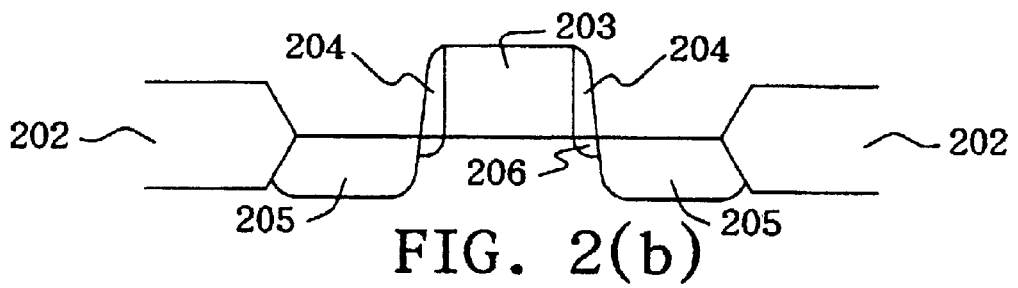

FIGS. 2(a) to 2(e) depicts structures achieved in steps of a method for forming the salicide according to a first embodiment of the present invention. First, a silicon substrate 201 having a gate structure 203, lightly doped regions 206 disposed at two sides of the gate structure 203, spacer 204 disposed on the sidewall of the gate structure 303 and field oxides 202 is provided, as shown in FIG. 2(a). Then, the spacer 204 and the gate structure 203 are regarded as a hard mask to proceed with a heavily doping step. Therefore, as shown in FIG. 2(b), the lightly doped regions 206 except the region under the spacer 204, will form source/drain regions 205, called lightly doped drain (LDD).

Figure 2C:
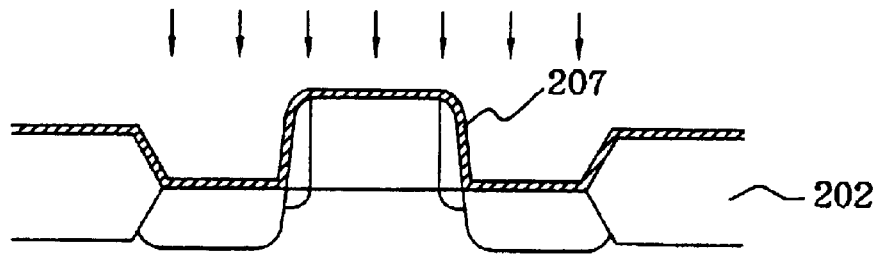

Then, a cobalt layer 207 is deposited on the surface of field oxides 202, the source/drain regions 205, the spacer 204 and the gate structure 203 by the chemical vapor deposition (CVD) or physical vapor deposition (PVD), shown in FIG. 2(c). In order to deposit the cobalt layer 207 more completely, a clean step is performed to remove impurities in the silicon substrate (such as a native oxide or residuals of a photo resist) before depositing the cobalt layer.

Figure 2D:
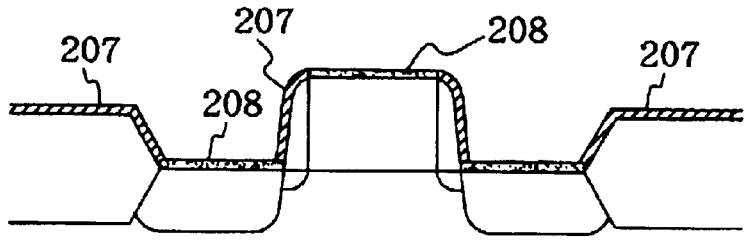
Figure 2E:
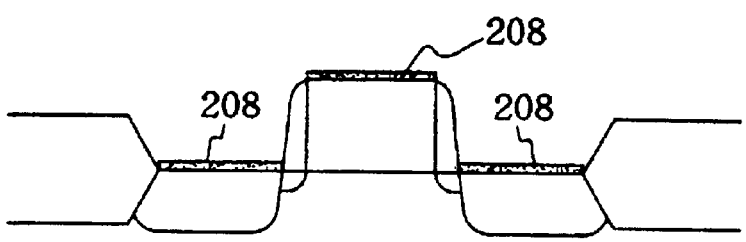

After the cobalt layer 207 is formed, an ionic implanting step is proceeded. The implanted ion will form a barrier such that a cobalt metal or cobalt silicide cannot penetrate into the silicon substrate 201. The ion of the ionic implanting step is selected from the group consisting of: fluorine, chlorine, bromine, iodine, boron and trifluroborane, preferably fluorine, boron or trifluoronorane. The dosage using in the ionic implanting step is between 1E13 and 2E15. Next, a thermal annealing process is proceeded with, so that the cobalt layer 207 will react with the polysilicon of the gate structure 203 and the silicon of the source/drain regions 205 to form a cobalt silicide layer 208. The reaction is called a silicification reaction. The cobalt layer 207 on the surface of the spacer 204 and field oxides 202 will not undergo the silicification, as shown in FIG. 2(d). The temperature of the thermal annealing process is between 400° C. and 1000° C. Finally, the unreacted cobalt layer 207 on the surface of the spacer 204 and field oxides 202 is removed to form a structure, shown in FIG. 2(e).

However, as the integrity of a transistor is increased, the size of the gate structure 203 is also becoming smaller and smaller. The silicification reaction of the cobalt layer performed with one step annealing process above-mentioned will make the reaction of the cobalt silicide layer 208 of the surface of the gate structure 203 and the source/drain regions 205 too fast and cover the boundary between the spacer 204 and the gate structure 203 and the boundary between the spacer 204 and the source/drain regions 205. Therefore, the cobalt silicide 208 on the gate structure 203 will contact with the cobalt silicide 208 on the source/drain regions 205 and then a short current is caused. Thus, according to the present invention, a silicification reaction of the cobalt layer 207 may be performed with two-steps annealing process to prevent from the short current above-mentioned. The first step of the annealing process is to make the cobalt layer 207 react with the polysilicon on the surface of the gate structure 203 and the silicon on the surface of the source/drain regions 205, so that an intermediate of cobalt silicide (CoSi and $CoSi_x$) is formed. However, the cobalt metal on the surface of the spacer 204 and field oxides 202 will not undergo the silicification reaction, shown in FIG. 2(d). The temperature of the first annealing step is between 400° C. and 600° C. Next, the unreacted cobalt metal on the surface of the spacer 204 and field oxides 202 is removed by wet or dry etching method, shown in FIG. 2(e). Then, a second annealing step is carried on in which the temperature is higher then the fist annealing step, such as between 600° C. and 800° C. Therefore, the intermediate of the cobalt silicide on the surface of the gate structure 203 and the source/drain regions 205 will form a cobalt silicide.

The method of the present invention is to perform an ionic implanting step before carrying on the thermal annealing process. Thus, the cobalt metal or the cobalt silicide will not penetrate into the silicon substrate or the gate structure during the silicidation reaction. Therefore, the junction current leakage caused by the spike phenomenon on the boundary between the cobalt layer and the source/drain regions or the gate structure is avoided. The ionic implanting step of the present invention is only to be performed before carrying on the silicidation reaction. That is, the ionic implanting step can be performed before or after the cobalt metal is deposited, or before or after the heavily doping step of the source/drain is carried on. There is no limitation to the present invention in this regard.

Figure 3A:
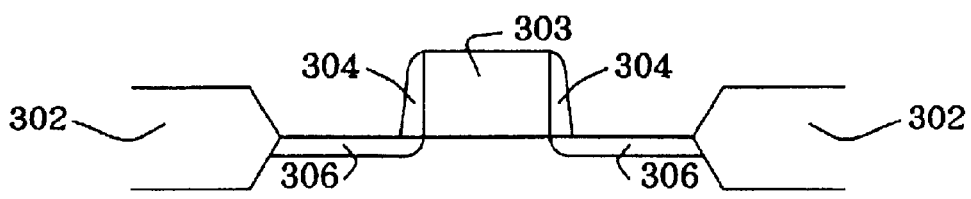
FIGS. 3(a) to 3(e) depict structures achieved in steps of a method for forming a self-aligned silicide according to a second embodiment of the present invention.
Figure 3B:
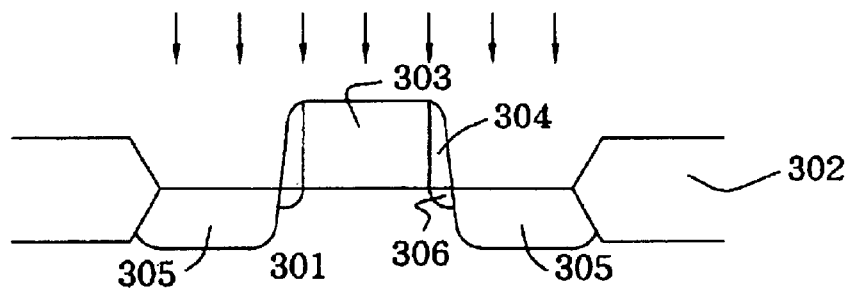
Figure 3C:
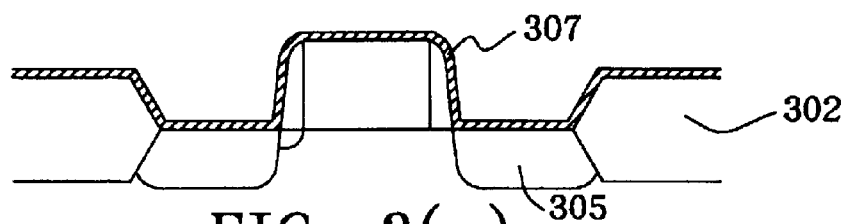
Figure 3D:
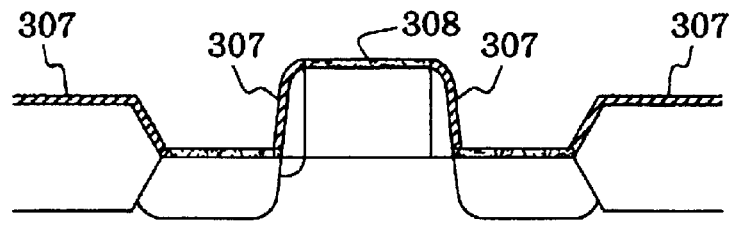
Figure 3E:
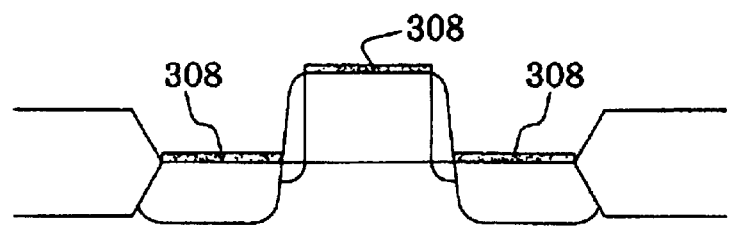

FIGS. 3(a) to 3(e) depict structures achieved in steps of method for forming a self-aligned silicide according to a second embodiment of the present invention. An ionic implanting step is carried on before depositing a cobalt metal. First, a silicon substrate 301 having a gate structure 303, a lightly doped region 306 disposed at two sides of the gate structure 303, spacer 304 disposed on the sidewall of the gate structure 303 and field oxides 302 is provided, as shown in FIG. 3(a.) Then, the gate structure 303 and the spacer 304 are regarded as a hard mask to proceed with a heavily doping step and source/drain regions 305 are formed. Next, an ionic implanting step is proceeded with, as shown in FIG. 3(b). Afterward, a cleaning step is carried on to remove impurities of the surface of the silicon substrate. A cobalt layer 307 is deposited on the surface of field oxides 302, the source/drain regions 305, spacer 304 and the gate structure 303, as shown in FIG. 3(c). Next, a one-step or two-step thermal annealing process above-mentioned is carried on to enable the cobalt layer to undergo a salicidation reaction, as shown in FIG. 3(d). Finally, the unreacted cobalt metal is removed and a MOS transistor with a salicide layer is formed, as shown in FIG. 3(e).

Figure 4A:
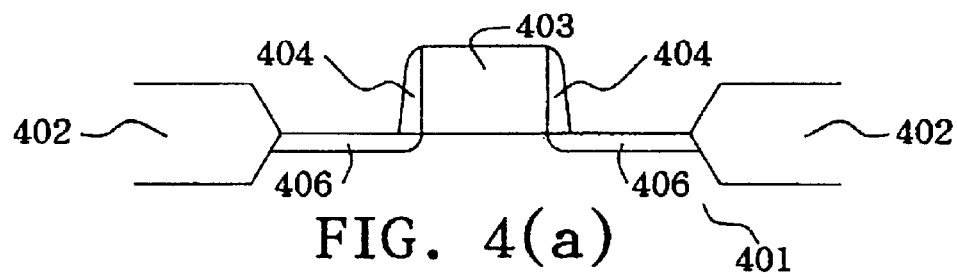
FIGS. 4(a) to 4(e) depict structures achieved in steps of a method for forming a self-aligned silicide according to a third embodiment of the present invention.
Figure 4B:
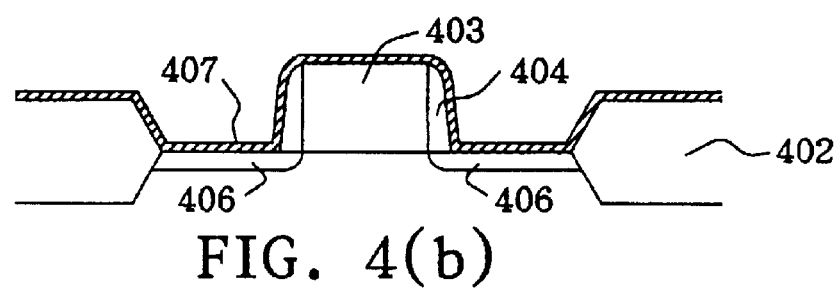
Figure 4C:
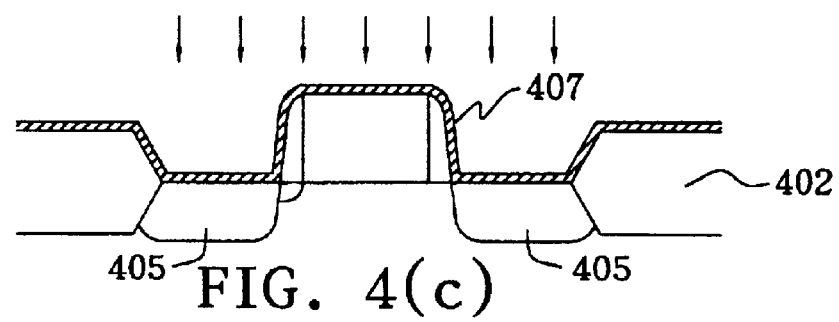
Figure 4D:
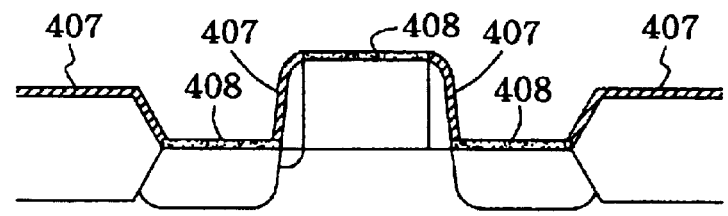
Figure 4E:
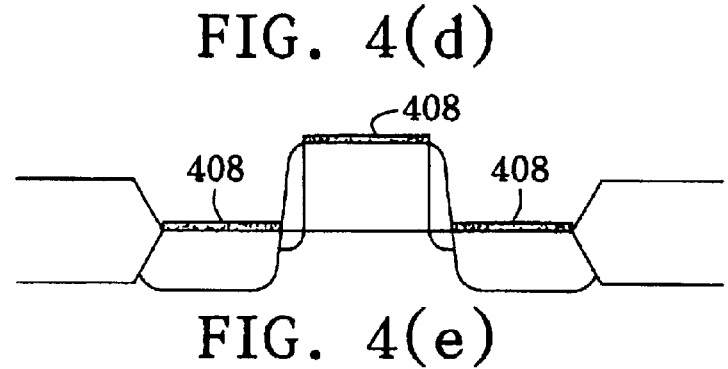

FIGS. 4(a) to 4(e) depict structures achieved in steps of method for forming a self-aligned silicide according to a third embodiment of the present invention. An ionic implanting step is carried on before forming heavily doped source/drain regions. First, a silicon substrate 401 having a gate structure 403, lightly doped regions 406 disposed at two sides of the gate structure 403, spacer 404 disposed on the sidewall of the gate structure 403 and field oxides 402 is provided, as shown in FIG. 4(a). Then, a cobalt layer 407 is deposited on the surface of field oxides 402, the lightly doped regions 406, the spacer 404 and the gate structure 403, as shown in FIG. 4(b). Next, an ionic implanting step is proceeded with. Next, a heavily doping step is performed to form source/drain regions 405, as shown in FIG. 4(c). Then, as described in the above paragraph, a one-step or two-step thermal annealing process is carried on to enable the cobalt layer to undergo a salicidation reaction, as shown in FIG. 4(d), and then the unreacted cobalt metal is removed.

Figure 5A:
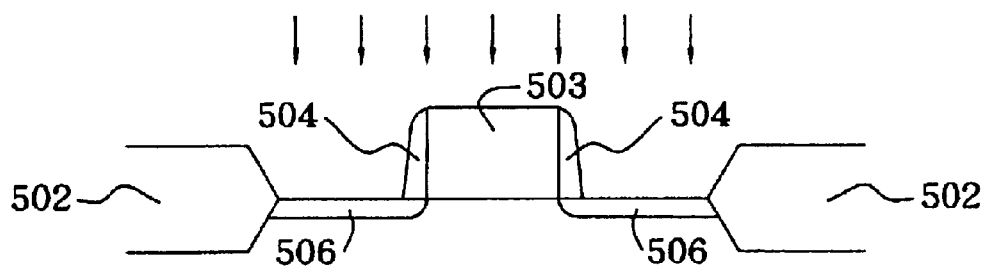
FIGS. 5(a) to 5(e) depict structures achieved in steps of a method for forming a self-aligned silicide according to a fourth embodiment of the present invention.
Figure 5B:
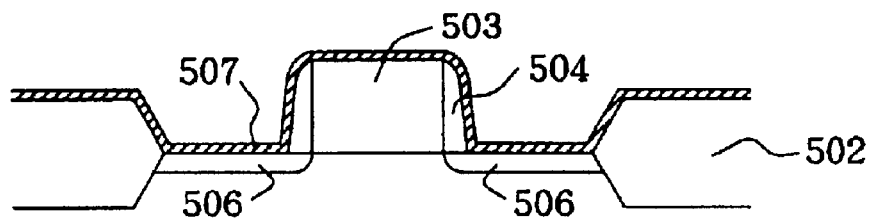
Figure 5C:
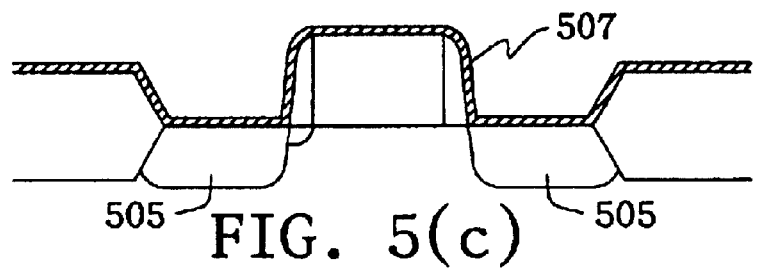
Figure 5D:
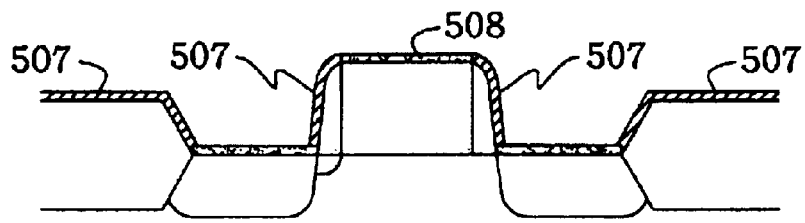
Figure 5E:
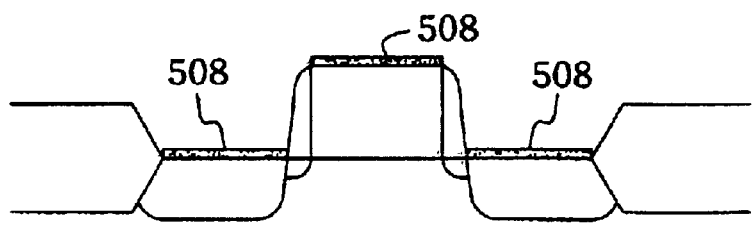

FIGS. 5(a) to 5(e) depicts structures achieved in steps of method for forming a self-aligned silicide according to a fourth embodiment of the present invention. An ionic implanting step is carried on before depositing a cobalt layer and forming the highly doped source/drain regions. Similarly, a silicon substrate 501 having a gate structure 503, lightly doped regions 506 disposed at two sides of the gate structure 503, spacer 504 disposed on the sidewall of the gate structure 503 and field oxides 502 is provided, as shown in FIG. 5(a). Then, a cobalt layer 507 is deposited on the surface of field oxides 502, the lightly doped regions 506, the spacer 504 and the gate structure 503, as shown in FIG. 5(b). Next, a heavily doping step is carried on to form source/drain regions 505, as shown in FIG. 5(c). Then, a one-step or two-step thermal annealing process is carried on to enable the cobalt layer to undergo a salicidation reaction, as shown in FIG. 5(d), and then the unreacted cobalt metal is removed.

Figure 6:
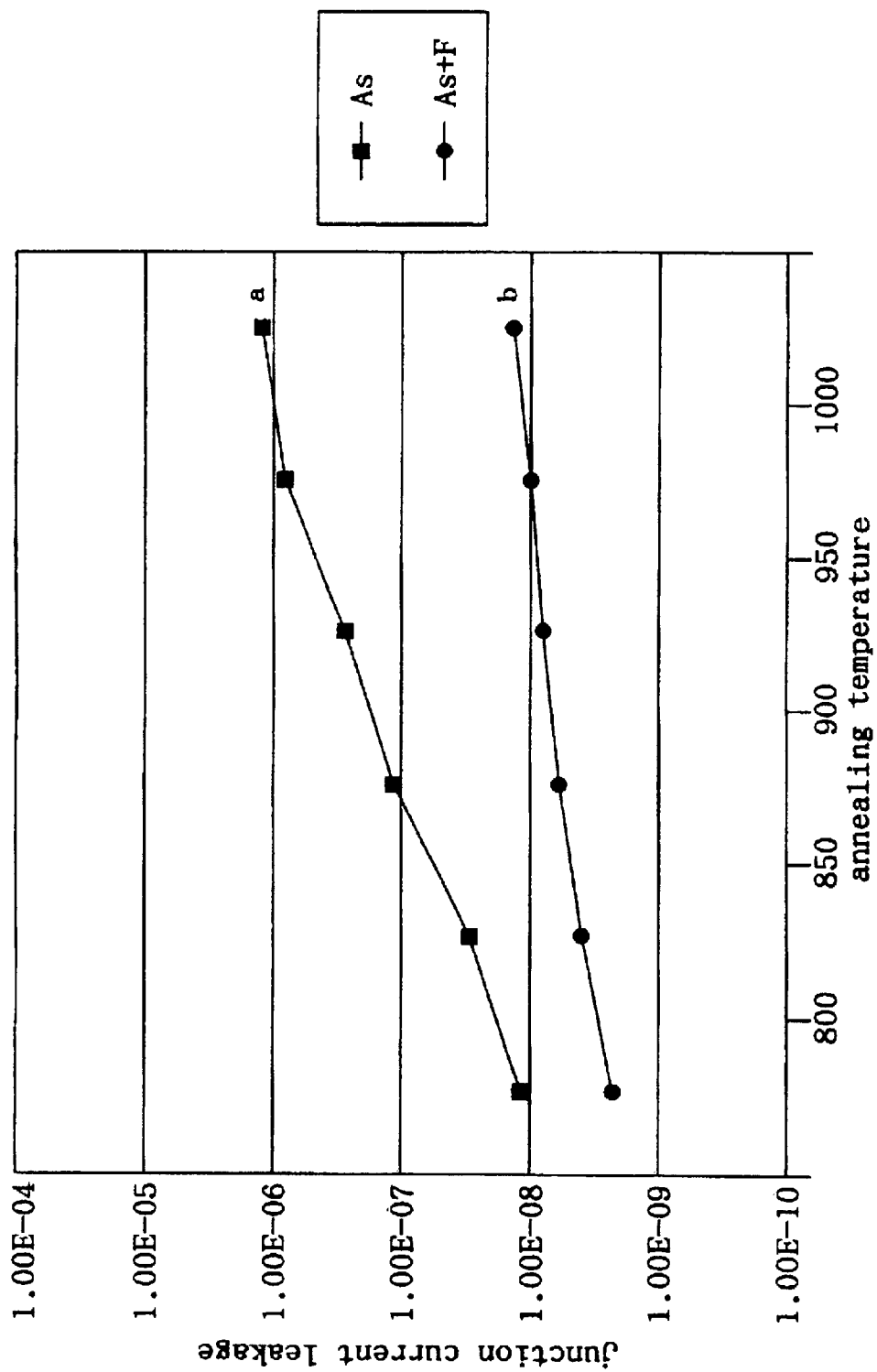
FIG. 6 depicts a diagram of junction leakage currents of cobalt silicides formed respectively by a conventional method and a method of the present invention.

FIG. 6 depicts a diagram of the junction leakage currents of the cobalt silicides formed by the conventional method and the method of the present invention, wherein the abscissa represents the temperature of thermal annealing process and the ordinate represents the current of junction leakage. A curve A represents the performance results of an NMOS transistor formed by the conventional method. A curve B represents the performance of an NMOS transistor formed by the method of the present invention in which a fluorine-implanting step is performed before carrying on the silicidation reaction. As shown in FIG. 6, the junction leakage current of the cobalt silicide formed by the present invention is smaller than that formed by the conventional method.

Figure 7:
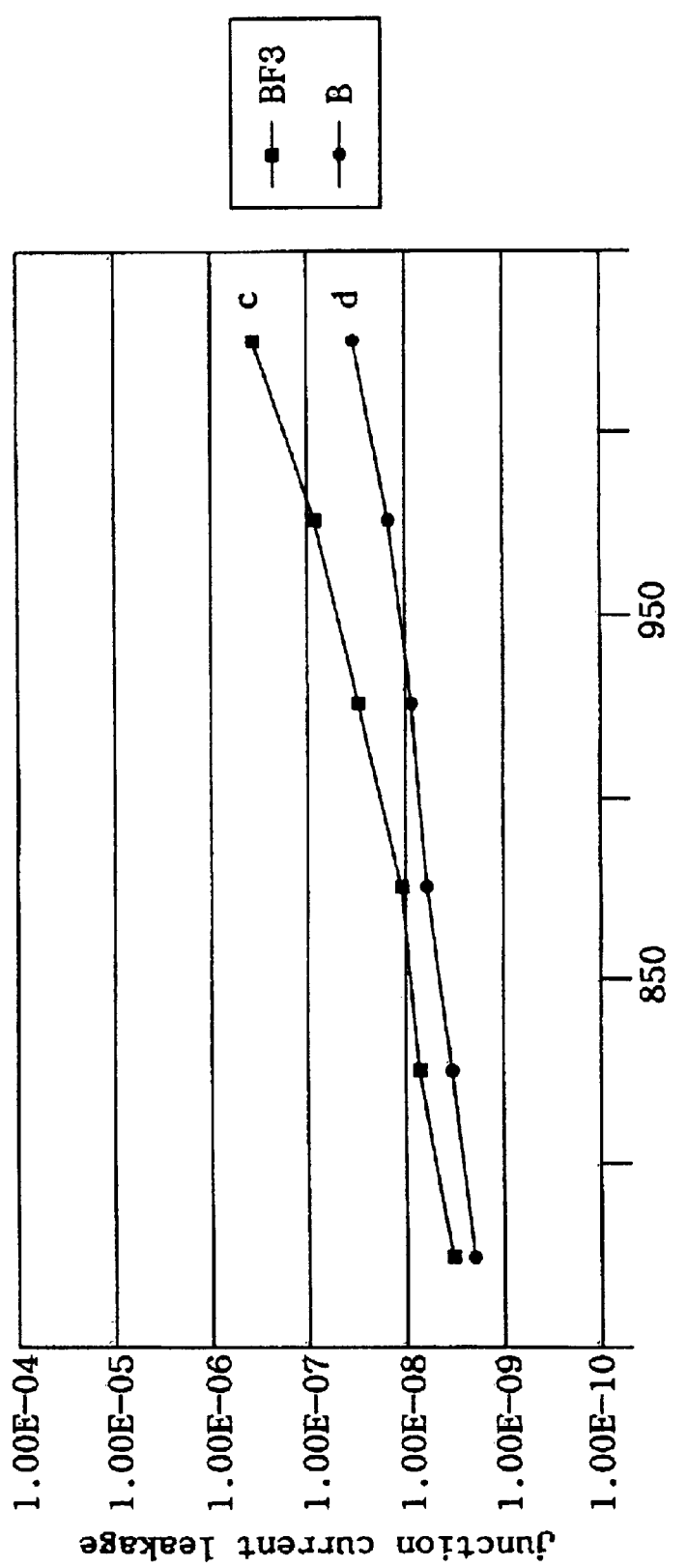
FIG. 7 depicts a comparative diagram of unction leakage currents of a cobalt silicide of the present invention implanted with boron and trifluoroborane, respectively.

FIG. 7 depicts a diagram of junction leakage currents of a cobalt silicide in a PMOS transistor implanted with different ions. A curve C represents the junction leakage current of a cobalt silicide implanted with trifluoroborane and curve D represents the junction leakage current of cobalt silicide implanted with boron b. As shown in FIG. 7, the junction leakage current of the cobalt silicide implanted with boron is smaller than that implanted with trifluoroborane. Moreover, as shown in FIGS. 6 and 7 the junction leakage current of the cobalt silicide layer formed by the present invention is decreased as compared with the conventional method.

The methods and features of this invention have been sufficiently described in the above examples. It should be understood that any modifications or changes without departing from the spirits of the invention are intended to be covered in the protection scopes of the invention.

What is claimed is:

1. A method for forming a self-aligned silicide on a metal oxide semiconductor, comprising the following steps of:

providing a silicon substrate comprising a gate structure, lightly doped regions disposed at two sides of the gate structure, a spacer disposed on a sidewall of the gate structure and field oxides;

performing an ionic implanting step wherein the ion used is selected from the group consisting of chlorine, bromine, iodine and trifluroborane;

depositing a cobalt layer on a surface of the field oxides, lightly doped regions, the spacer and the gate structure after the ionic implanting step;

performing a heavily doping step after the cobalt layer is deposited to form the source/drain regions;

performing a thermal annealing step to convert the cobalt metal on the surface of the source/drain regions and the gate structure into a cobalt silicide after the heavily doping step; and removing unreacted cobalt on the surfaces of the spacer and field oxides.

2. The method of claim 1, further comprising a cleaning step for removing impurities on the surface of the silicon substrate before the cobalt layer is deposited.

3. The method of claim 1, wherein the dosage of ion used in the ionic implanting step is between 1E13 and 2E15.

4. The method of claim 1, wherein the temperature of the thermal annealing process is between 400° C. and 1000° C.

5. The method of claim 1, wherein the thermal annealing process comprising the following steps of:

proceeding with a first annealing step to make the cobalt metal on the surface of the gate structure and the source/drain regions to undergo a silicidation reaction and become an intermediate of cobalt silicide;

removing the unreacted cobalt metal on the surface of the spacer and field oxides; and proceeding with a second annealing step to convert the intermediate of the cobalt silicide on the surface of the gate structure and the source/drain regions into the cobalt silicide.

6. A method for forming a self-aligned silicide of a metal oxide semiconductor, comprising the following steps of:

providing a silicon substrate comprising a gate structure, lightly doped regions disposed on two sides of the gate structure, a spacer disposed on the sidewall of the gate structure and field oxides;

performing a ionic implanting step wherein the ion used is selected from the group consisting of chlorine, bromine, iodine and trifluroborane;

performing a heavily doping step to form source/drain regions after the ionic implanting step;

depositing a cobalt layer on the surface of field oxides, the source/drain regions, the spacer and the gate structure after the heavily doping step;

performing a thermal annealing step to convert the cobalt metal on the surface of the source/drain regions and the gate structure into a cobalt silicide after the cobalt layer is deposited; and removing unreacted cobalt on the surfaces of the spacer and field oxides.

7. The method of claim 6, wherein the dosage of ion used in the ionic implanting step is between 1E13 and 2E15.

8. The method of claim 6, further comprising a cleaning step of removing the impurities on the surface of the silicon substrate before the cobalt layer is deposited.

9. The method of claim 6, wherein the temperature of the thermal annealing process is between 400° C. and 1000° C.

10. The method of claim 6, wherein the thermal annealing process comprises the following steps of:

proceeding with a first annealing step to make the cobalt metal on the surface of the gate structure and the source/drain regions to undergo a silicidation reaction and to form an intermediate of the cobalt silicide;

removing unreacted cobalt metal on the surface of the spacer and field oxides; and proceeding with a second annealing step to convert the intermediate of the cobalt silicide on the surface of the gate structure and the source/drain regions into the cobalt silicide.

* * * * *